United States Patent [19]

Schultz

[11] Patent Number: 5,065,278

[45] Date of Patent: Nov. 12, 1991

[54] CAST HOUSING ENCASED CATV POWER SUPPLY UNIT

[75] Inventor: Jerry Schultz, Dadeville, Ala.

[73] Assignee: Power Guard, Opelika, Ala.

[21] Appl. No.: 470,607

[22] Filed: Jan. 29, 1990

[51] Int. Cl.$^5$ ............................................. H05K 7/20
[52] U.S. Cl. .................................. 361/383; 361/389; 361/394; 361/427
[58] Field of Search .............................. 361/386–389, 361/394, 395, 399, 427

[56] References Cited

U.S. PATENT DOCUMENTS 3,359,460 12/1967 Ragone et al. ...................... 361/380
3,721,865 3/1973 Rademaker et al. ................ 361/380
4,823,233 4/1989 Brown et al. ....................... 361/380
4,908,734 3/1990 Fujioka ............................... 361/383

Primary Examiner—Gregory D. Thompson
Attorney, Agent, or Firm—Low and Low

[57] ABSTRACT

A rugged, long-life housing encased power supply unit for CATV systems wherein all electrical components are fully sealed from the atmosphere and wherein further the power supply unit may be uniquely mounted in suspended relation from a cable or the like, while also being capable of wall or post mounting, and providing full protection of the electrical components while permitting necessary heat dissipation.

7 Claims, 2 Drawing Sheets

CAST HOUSING ENCASED CATV POWER SUPPLY UNIT

BACKGROUND OF THE INVENTION

In connection with cable television systems, it is necessary to provide one or more power supply units for the CATV system which interconnect with a line carrying the usual available utility or power company line voltage of 115 volts AC (115 VAC) and converts the same to the normal lower desired voltage, preferably 60 VAC, although in some instances a differing CATV voltage may be employed, as 30 VAC.

The conversion is effected by transformer circuitry of generally known nature, and again preferably employs a ferroresonant transformer to step down the voltage as well as to smooth out transient power swings and other irregularities. Circuit time delay means may be provided to enhance the in-use effectiveness of the power supply, which may not be always quickly o readily accessible.

Such a CATV power supply must be appropriately mounted for security, ruggedness, and especially adequate cooling, among other desired features. Conventionally, as with much electrical equipment, CATV power supplies are mounted within sheet metal cabinets with doors or removable covers, and the same are louvered in usual manner as by partially striking out portions of the sheet metal so as to provide ventilation to the transformer circuitry.

Illustrative louvered sheet metal power supplies of this type are the Model PS-60 marketed by RMS Electronics, Inc., Bronx, NY or Model NS 30/60-15 of Power Technologies Inc., Redmond, WA.

While such sheet metal enclosures are serviceable, the same possess inherent disadvantages of lack of ruggedness by virtue of the relatively thin bent sheet metal housing, and also have substantially open access to the atmosphere, moisture, and particulate debris by virtue of the louvered vent openings, thereby minimizing the service life of the transformer components, but also of the housing itself. Indeed, existence of openings such as louvres also facilitates tampering with and damaging the power supply housing by the use of prying tools in the housing openings.

Additionally, such housings do not lend themselves for ready adaptation to diverse mountings as may be required in one or more given installations.

BRIEF SUMMARY OF THE INVENTION

It is an object of the present invention to provide a unique cast housing encased power supply for CATV service and the like wherein versatility of mounting the same is achieved, whether pole-mounted, or on another standard, or supported by a transverse guy cable.

It is a further object to enhance security of such CATV power supplies by virtue of providing a rugged cast housing free from through access openings such as louvers and the like, which can withstand rough handling as well as defeat unauthorized efforts to gain access thereto.

The CATV power supply housing of the invention further enhances life and duty service of the transformer circuitry by providing effective cooling by means of ample fin radiators and wherein also the housing is fully sealed against the elements, whereby dust, moisture, etc. cannot adversely affect the ferroresonant transformer system.

To this end, the transformer system includes a cast aluminum housing of two components in essentially clamshell form, wherein the transformer, capacitor, time delay components and related circuitry are carried within one half portion with appropriate external connections, and peripheral seal means between the two portions precludes access of moisture or the like thereto.

Further, the housing includes means selectively secured thereto to permit mounting of the housing on a vertical standard, as a pole, or on a vertical wall surface, and as well onto a substantially horizontal reach of cable.

Deep fins provided over the entire surface of the housing ensure adequate cooling thereof by ready conduction of internally generated heat through the aluminum walls for dissipation by the fins, all without providing unwanted apertures, openings or louvers that adversely affect the power supply utility in several respects as noted above.

BRIEF DESCRIPTION OF THE DRAWINGS

The invention will be better understood in connection with the accompanying drawings, in which.

DESCRIPTION OF THE PREFERRED EMBODIMENT

Figure 1:
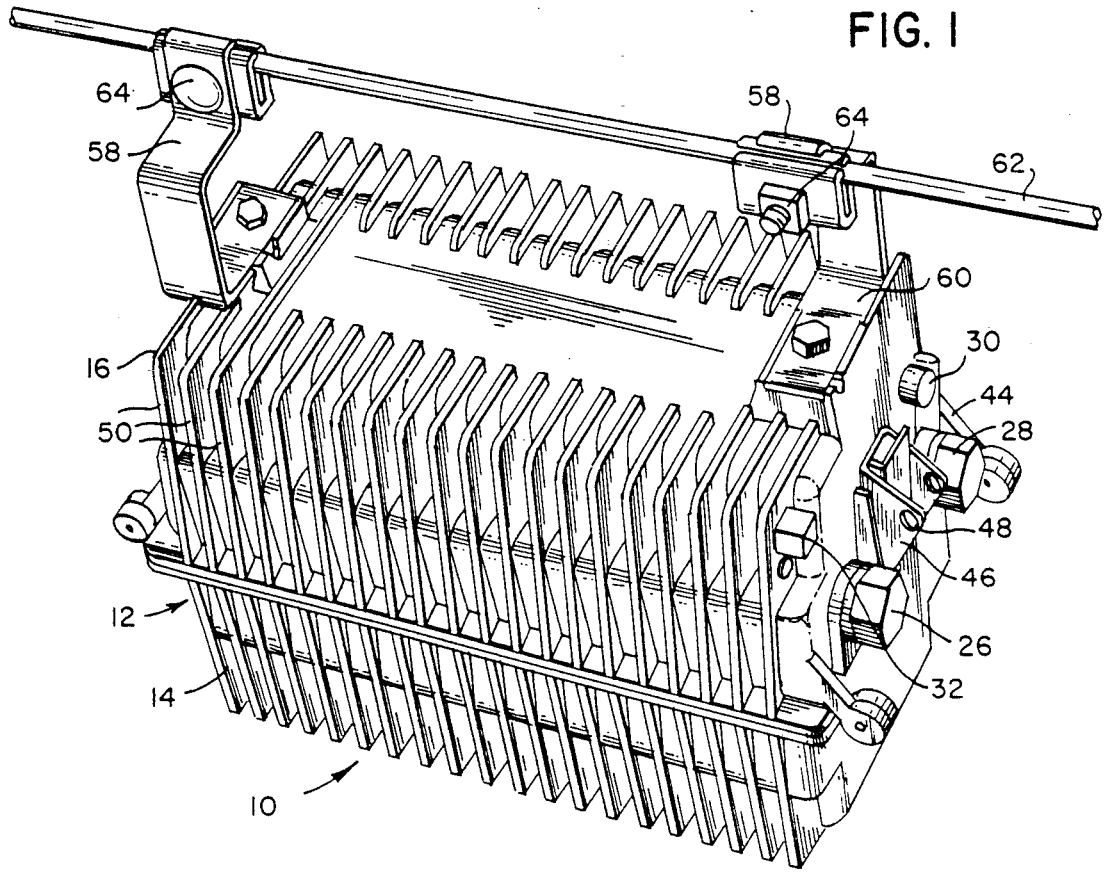
FIG. 1 is a perspective view of the power supply unit of the invention, and illustratively showing one form of suspended mounting.
Figure 2:
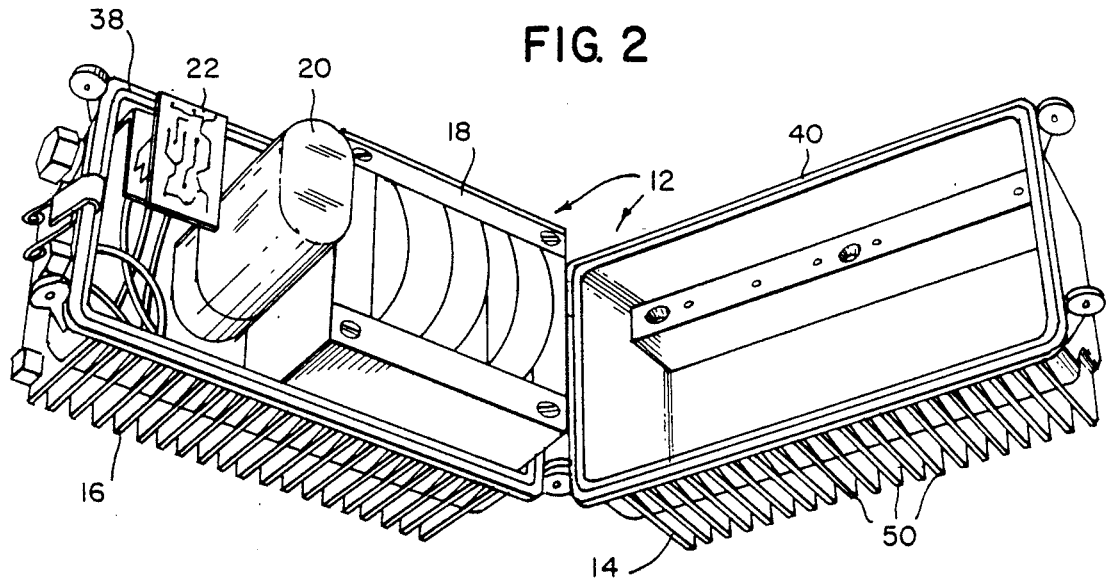
FIG. 2 is a perspective view of the power supply unit of the invention, with the housing being opened and generally showing the power supply components therein.

Referring to the drawings, there is shown at 10 the encased power supply unit of the invention which includes a rugged cast housing 12 having similar clamshell-like hinged halves 14, 16. Preferably, suitable trademark markings are provided on the exterior of the housing, as indicated.

Disposed within the housing, and fully encased therein when the housing 12 is closed are the power supply components required for cable television connections, and principally including a ferroresonant transformer 18, a capacitor 20, time delay circuitry 22, along with appropriate internal wiring and connections illustratively shown at 24. The components are secured as by screws and bolts entirely within the housing portion 16, and the depth of housing portion 14 is sufficient to freely receive the projecting portions of the components 18, 20, 22.

Housing portion 16 is provided with fittings 26, 28 at one end thereof to serve respectively as an AC conduit port for a 115 VAC line to be connected thereto, and a cable adapter, with respective connections within the housing, as is known in the art, and ar fully sealed to preclude moisture leakage therethrough. The system also includes a green or other color operation indicator lamp 30 (FIG. 1) carried by the housing, as well as a ground lug attachment at 32.

Figure 3:
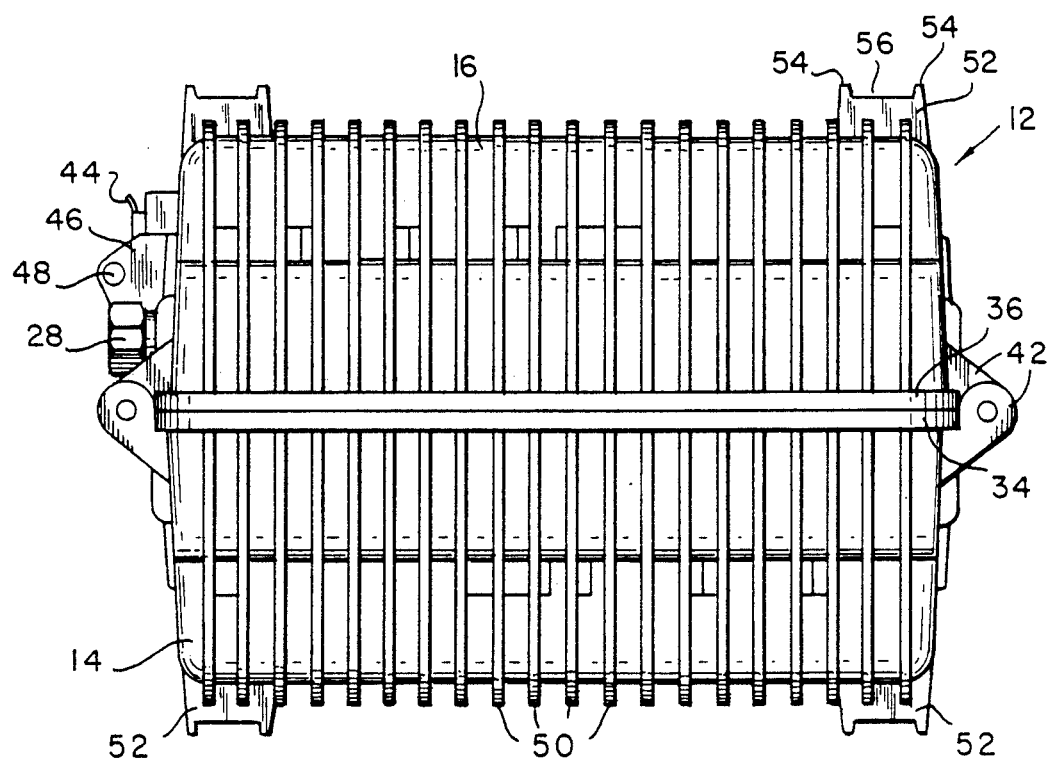
FIG. 3 is a side elevation of the power supply unit.

The housing 12 further includes planar full peripheral flanges 34, 36 on the portions 14, 16, respectively which meet in face-to-face relation as well seen in FIG. 3. Both flanges are provided with full annular grooves, as at 38 on portion 16, and a complementary ring of sealing material 40, as neoprene or comparable elastomer, is received within the groove of housing portion 14 and seats within groove 38 when the housing is closed to fully seal between the facing housing portions.

Each housing portion is provided with ears 42, 42 which lie in adjacent relation and carry pivot means in known manner to permit hinge opening and closing of housing 12. To maintain the housing closed, toggle latch means of known form is provided at the end of the housing opposite the hinges, and includes a latch lever 44 recessed between upstanding ears 46 when latched, whereby securing means as the shank of a lock may be inserted through apertures 48 in the ears 46 to preclude unauthorized opening of the housing.

The ruggedly cast aluminum housing is further provided throughout its periphery with an extensive series of heat-radiating fins 50 which occupy substantially all available surface area of the housing. In this manner, notwithstanding the rugged and sealed character of the housing about the encased power supply components, heat generated thereby is readily dissipated to the atmosphere without reliance upon unwanted openings as louvers and the like as heretofore employed in CATV power supply units.

The respective top and bottom faces of the housing 12 include a pair of cast pedestals 52 at each end thereof having a shallow U-configuration in side elevation, as seen in FIG. 3, defined by parallel ribs 54 on either side of a central flat 56. The pedestals provide versatile means for mounting means forming part of the power supply unit 12. One such mounting means comprises a pair of hooks 58 including flat legs 60 which seat at 56, and are secured to the housing by means of screws extending through leg openings into suitable recess openings in the pedestal flats. The legs are confined on either side by the ribs 54 thereby to prevent pivoting or swivelling of the hooks about the screw axis. The hooks 58 extend upwardly terminating in known manner in a U-shaped hook portions which engage suspension means as cable 62, to which they are rigidly clamped by nut and bolt means 64.

With the cable suspension support of FIG. 1, it will be seen that the power supply unit is fixedly secured in a manner that is substantially inaccessible to unauthorized personnel, in addition to the fully sealed, latched, and locked housing itself, while yet being fully open to ambient air currents to effect proper cooling through the full surface fins 50.

Further, such suspension mounting of a CATV power supply unit as at 10 contrasts sharply with conventional practice wherein CATV power supply units in the usual sheet metal cabinets are fixedly mounted only upon posts or against walls, and are incapable of nor have means for mounting the same in suspended manner, as by upon a stranded cable 62.

Figure 4:
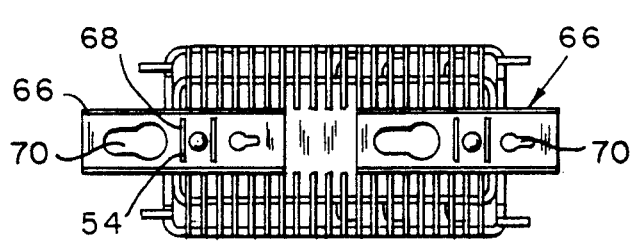
FIG. 4 is a top elevation thereof showing a further form of mount bracket means associated with the housing; and, FIG. 5 is a perspective view of the mount bracket means of FIG. 4.
Figure 5:
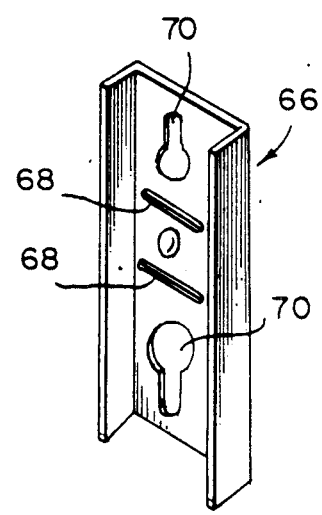

FIGS. 4 and 5 show an alternate form of mounting means which is particularly adapted for pole, post or wall mounting of the power supply unit 10. Instead of the suspension hooks 58 of FIG. 1, there are provided shallow U-shaped brackets 66 which are transversely slotted at 68 to receive the ribs 54 of pedestals 52 as seen in FIG. 4. Bracket 66 is apertured to receive a securing screw in mounting the same longitudinally on the housing 12. Each bracket has keyhole or like apertures 70 at each end thereof of varying size to accommodate lag screws, hanging bolts, or like means in mounting the power supply unit 10 in a vertical position on a standard or pole.

From the foregoing it will be seen that the housing encased power supply unit of the invention provides a thoroughly reliable and trouble-free system for long service duty and minimum maintenance, in addition to the other advantages as set forth.

While I have described a preferred form of my invention, it is evident that the principles and features thereof may take other specific forms from that shown within the scope and spirit of the appended claims.

What I claim is:

1. An encased primary power supply for CATV comprising,
   a rigid metal housing having a pair of facing portions,
   electrical power supply elements carried within one of said housing portions,
   electrical connector port means in said housing,
   means electrically connected said connector port means to said electrical power supply elements,
   seal means between said housing portions,
   means securing said housing portions together to sealably encase said power supply elements,
   heat dissipating means carried by said housing,
   a said housing portion having a pedestal for receiving mounting bracket means secured thereto for mounting said power supply unit in service,
   said pedestal including a flat upper surface for receiving said mounting bracket means thereon,
   and a pair of upstanding ribs on either side of said flat surface,
   thereby to provide a rugged, encased, long-life and fully sealed power supply unit for CATV use.

2. The encased power supply for CATV of claim 1 wherein said mounting bracket means includes an upstanding hook having a leg disposed on said pedestal between said ribs, and means for securing said hook to a suspension means as a cable, thereby to suspend said power unit therefrom.

3. The encased power supply for CATV of claim 1 wherein said mounting bracket means includes a planar portion for reception upon said pedestal, and further has slot means for reception therethrough of said ribs, thereby to orient said bracket means to said housing.

4. The encased power supply for CATV of claim 3 wherein said mounting bracket means includes aperture means for receiving screw or bolt means therethrough in mounting said unit in service.

5. The encased power supply for CATV of claim 1 wherein said housing portions are hingedly connected, and wherein said securing means comprises releasable latch means for securing said hinged housing portions in closed relation.

6. The encased primary power supply for CATV of claim 1 wherein said power supply elements include a ferroresonant transformer, a capacitor, and time delay circuitry in said housing.

7. The encased primary power supply for CATV of claim 1 wherein said housing is of cast aluminum, and said heat-dissipating means are fins cast integral therewith over substantially the entire external surfaces of the housing portions to disperse heat from said transformer and other power supply elements.

* * * * *

UNITED STATES PATENT AND TRADEMARK OFFICE
CERTIFICATE OF CORRECTION

PATENT NO. : 5065278
DATED : November 12, 1991
INVENTOR(S) : Jerry D. Schultz

It is certified that error appears in the above-identified patent and that said Letters Patent is hereby corrected as shown below:

TITLE PAGE

In the heading of the patent, the inventor's name should read:

JERRY D. SCHULTZ

Column 2, line 64, "ar" should read --- are ---

Signed and Sealed this

Twenty-third Day of February, 1993

Attest:

STEPHEN G. KUNIN

*Attesting Officer*  Acting Commissioner of Patents and Trademarks